United States Patent
Amano et al.

(10) Patent No.: US 6,714,281 B1
(45) Date of Patent: Mar. 30, 2004

(54) EXPOSURE APPARATUS AND DEVICE MANUFACTURING METHOD

(75) Inventors: Toshitaka Amano, Kaminokawa-machi (JP); Osamu Morimoto, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/521,211

(22) Filed: Mar. 8, 2000

(30) Foreign Application Priority Data

Mar. 12, 1999 (JP) ............................................. 11-066878

(51) Int. Cl.⁷ ........................ G03B 27/52; G03B 27/42; G01N 21/86
(52) U.S. Cl. .......................... 355/55; 355/53; 250/548
(58) Field of Search .................... 355/53, 55; 250/548, 250/201.1, 201.2; 356/399, 400, 401

(56) References Cited

U.S. PATENT DOCUMENTS 5,483,056 A * 1/1996 Imai ........................ 250/201.4
5,801,815 A * 9/1998 Takahashi ..................... 355/53
6,151,102 A * 11/2000 Nishi ........................... 355/53

FOREIGN PATENT DOCUMENTS

JP          9-260269          10/1997

* cited by examiner

*Primary Examiner*—Alan Mathews
(74) *Attorney, Agent, or Firm*—Fitzpatrick, Cella, Harper & Scinto

(57) ABSTRACT

An exposure apparatus or a device manufacturing method, wherein a focus measuring device measures a best focus position upon projecting and exposing, through a projection optical system, a pattern of an original plate onto a substrate placed on a movable stage, by obtaining predetermined estimating information indicative of a blur degree of an image being observed, when observing a reference mark on the movable stage or the surface of the substrate by the focus measuring device, while changing a relative position between the movable stage and the projection optical system toward an optical axis direction of the projection optical system. This exposure apparatus or device manufacturing method controls whether or not the best focus position is measured, based on (i) an elapsed time after a last projection and exposure or (ii) the estimating information obtained at a predetermined time by the focus measuring device and estimating information obtained at the time of measuring the best focus position at the preceding time.

11 Claims, 14 Drawing Sheets

MEASURE AUTO-FOCUSING OF REFERENCE MARK DURING EXPOSURE

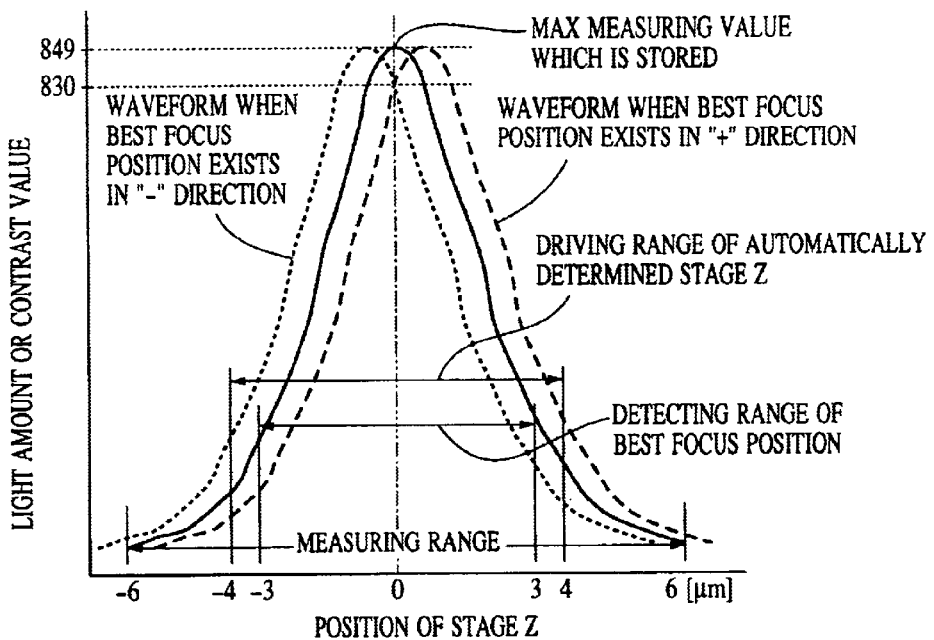
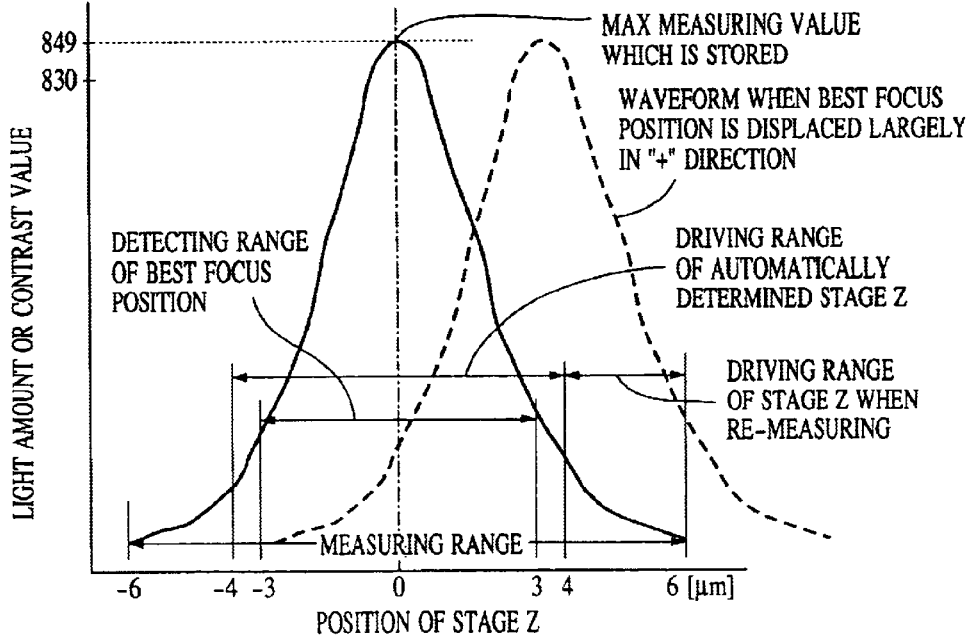

EXPOSURE APPARATUS AND DEVICE MANUFACTURING METHOD

BACKGROUND OF A INVENTION

1. Field of the Invention

The present invention relates to an exposure apparatus of a projection type or the like for a semiconductor circuit apparatus such as an IC, LSI, and VLSI, and a device manufacturing method capable of using this apparatus. More particularly, the present invention relates to an exposure apparatus of a projection type having an auto-focusing control function a time of repetitively reducing and projection-exposing a circuit pattern of a reticle onto a semiconductor wafer surface, a so-called auto-focusing function and a device manufacturing method using the apparatus, preferably in the field of manufacturing a semiconductor device.

2. Description of the Related Art

In a projection exposure apparatus employed in the manufacture of a semiconductor device, the alignment of a reticle and a wafer at a high precision is required so as to transfer a circuit pattern as a mask, formed on the reticle, onto a photoresist layer on a wafer, glass plate, etc., as a photo-substrate at a high precision of alignment. There has been known a technique such that in a projection exposure apparatus such as a stepper, the alignment of a reticle and a wafer is executed by both reticle alignment to align a reticle with a projection exposure optical system and wafer alignment to align a wafer with the projection exposure optical system. As for a reticle alignment method, there are methods, e.g., an FRA (Fine Reticle Alignment) method, which have been disclosed by the present applicant. As for a wafer alignment method, there has been known a TTL (Through-The-Lens) method of directly aligning the wafer with the projection optical system, an off-axis method of aligning the wafer with an observation optical system having another optical axis different from that of the projection optical system, and the like.

FIG. 1 is a schematic diagram of a projection exposure apparatus having an auto-focusing function by the TTL method, which has been disclosed in Japanese Patent Application Laid-Open No. 9-260269. Referring to FIG. 1, reference numeral 6 denotes a reticle which is held to a reticle stage 7. A projection lens (exposure lens) 9 allows a circuit pattern on the reticle 6 to be reduced to ⅕ or ⅒ in size onto a wafer 12 on an xyz stage (a wafer stage) 11, thereby forming an image and exposing it. In FIG. 1, a reference flat mirror 13, in which a surface of the mirror 13 is almost aligned with an upper surface of the wafer 12, is arranged at a position adjacent to the wafer 12. A stage reference mark 13a (mark for detecting focus) in FIG. 2 is formed onto the reference flat mirror 13. The xyz stage 11 can move in an optical axis (z) direction of the projection lens 9 and in a surface (x, y) perpendicular thereto and, of course, be rotated around the optical axis. An illumination optical system shown by component elements 1 to 5 in FIG. 1 illuminates an area in a picture plane of the reticle 6 where a circuit pattern is transferred.

A light-emitting portion of a light source 1 for exposure is positioned at a first focus of an elliptical mirror 2. Light emitted from the light source 1 is made incident to an optical integrator (fly eye lens) 3 where the light incident surface is positioned to a second focus position of the elliptical mirror 2 and a light emitting surface of the optical integrator 3 forms a secondary light source. The light emitted from the optical integrator 3 as a secondary light source illuminates the reticle 6 via a lens for illumination 4 and a field lens 5.

Component elements 10, 13, and 14 form an auto-focusing optical system of an off-axis type. Reference numeral 10 denotes a projection optical system (auto-focusing incident system). Light beams as non-exposing light emitted from the projection optical system 10 are converged and reflected to a point on the reference flat mirror 13 (or an upper surface of the wafer 12). The light beams reflected by the reference flat mirror 13 are made incident to a detection optical system (auto-focusing light-receiving system) 14. A light receiving device for position detection (not shown) is arranged in the detection optical system 14, and constructed so that an incident light point of the light receiving device for position detection is made conjugate to a reflecting point of light beams on the reference flat mirror 13. A positional offset in the optical axis direction of the reduction projection lens 9 of the reference flat mirror 13 is measured as a position offset of incident light beams on the light receiving device for position detection in the detection optical system 14.

Transmitted to an auto-focusing control system 32 is the positional offset from a predetermined reference surface of the reference flat mirror 13, which the detection optical system 14 has measured. The auto-focusing control system 32 instructs a driving system 33 for driving the xyz stage 11, to which the reference flat mirror 13 is fixed, to move toward the z-direction. When a detection optical system 27, as will be explained hereinafter, detects a TTL defocus position, the auto-focusing control system 32 drives the reference flat mirror 13 to move up and down in the optical axis direction (z direction) of the projection lens 9 near a predetermined reference position. The auto-focusing control system 32 also controls a position of the wafer 12 during exposure.

Next, the description turns to component elements for detecting a focusing state on the surface of the wafer 12, driving the wafer stage 11 on the basis of the detected signal, and detecting an in-focus position of the projection lens 9. Reference numeral 27 denotes a TTLAF (Through The Lens Auto-Focusing) detection optical system having component elements 23, 24, 26, 40, and 41, which will be mentioned hereinafter. Illuminating light beams emitted from a fiber 40 pass through a half mirror 41 and are converged near the reticle 6 via an objective lens 24 and a mirror 23. A translucent portion (opening window portion) (not shown) having a predetermined size is set at a position in an area other than an actual device area on the reticle 6. The illuminating light beams pass through the opening window portion and, thereafter, are converged on the reference flat mirror 13 via the projection lens 9. As discussed above, a stage reference mark (mark for focus detection) 13a is marked onto the reference flat mirror 13, as shown in FIG. 2. Reflecting light from the reference flat mirror 13 is returned through an original light path, reflected to the half mirror 41 through the projection lens 9, opening window portion, mirror 23, and objective lens 24 according to this order and is made incident onto a position sensor 26.

The reference flat mirror 13 is arranged onto the wafer stage 11 similar to the wafer 12, and is fixed to the focusing surface, almost matching the wafer 12. The auto-focusing control system 32 controls focus positions of the wafer surface 12a and the stage reference surface 13a of the flat mirror 13 or focus offset amounts between both of these surfaces. As a result, in accordance with a successive sequence, the reference flat mirror 13 is focused and only the supply of a predetermined offset amount results in automatically focusing the actual wafer thereon.

As shown in FIG. 2, the stage reference mark 13a is composed of lines and spaces in the vertical direction, which have a predetermined line width. Light beams emitted from the stage reference mark 13a on the reference flat mirror 13 return in the passed path (in the pass-back path) and reach the objective lens 24. The light beams passing through the objective lens 24 are reflected to the half mirror 41 at a next time, and an image is formed onto a sensor surface 26a of the position sensor 26. The position sensor 26 may be a one-dimensional array sensor or two-dimensional array sensor, e.g., a CCD is a typical sensor. Corresponding to the stage reference mark 13a (in FIG. 2), it is sufficient to use the one-dimensional array sensor if detecting a focus only in a one-directional pattern (longitudinal line or lateral line), and the two-dimensional array sensor is used if it is necessary detect a focus in a two-directional pattern (both longitudinal line and lateral line).

In order to obtain the best focusing surface, the surface of the reference flat mirror 13 is oscillated in the optical axis direction of the exposure lens 9. Corresponding to the position at this point, the apparatus is capable of obtaining information such that the focusing state of the stage reference mark 13a (in FIG. 2) is changed. The apparatus is not specifically limited as to which kind of focusing information is employed as a signal. Focusing information may be employed such that light intensity contrast of an image of the stage reference mark 13a is at the highest level at the best in-focus position and decreased at the defocusing position. Also, a differential value (corresponding to an inclination angle) of a light profile of an image of the stage reference mark 13a may be estimated. These signal processes are performed by an image signal analyzing circuit 47.

The related art has: a first process to focus the wafer surface on the best image-forming surface of the projection lens 9 by first exposing and transferring a pattern on the reticle 6 onto the wafer 12 actually; a second process to detect the best image-forming position on the surface of the wafer 12 or equivalent thereto by the TTL focus detection optical system 27 at a first time almost similar to that of the first process; and a third process to detect the best image-forming position of the surface of the wafer 12 or equivalent thereto by the detection optical system 27 during exposure of the wafer 12 or at a second time different from the first time. Based on the result of detecting the best focus position obtained by the third process, the surfaces of the reticle 6 and wafer 12 are always corrected to the best focusing state.

The next description turns to a specific operation of a conventional TTL auto-focusing method. FIG. 3 is a flowchart showing the sequence of auto-focusing detection. As shown in FIG. 3, first of all, the focus of the detection optical system 27 is coarsely adjusted to the reticle pattern surface 6a (step S1). Originally, the purpose of this step is to prevent a measuring range from being displaced. Next, a focus origin is set between the reticle 6 and the wafer 12 by printing. Specifically speaking, a reticle pattern (for example, a resolution chart or an actual device pattern) is printed at a plurality of positions on the wafer 12, while changing the focus of the wafer surface 12a (steps S2 and S3). The wafer 12 is once developed (step S4). A printed image is measured by means such as an SEM and the best focusing surface is determined (step S5).

On the other hand, at almost the same time as that of the first process (which means that this time is within a sufficiently short time during which the focusing state of the apparatus does not change), the above-discussed detection optical system 27 is used and the focusing measurement is repeated by sending the stage reference mark 13a and changing the focus thereof (steps S6 and S7). The best focusing surface is automatically determined by the use of the signal obtained by the position sensor 26 (step S8).

After the best focusing surface is obtained, this information is inputted to the apparatus as a focus offset (step S9). The offset input means corrects the origin displacement amount between an actual best exposure focus and the best in-focus surface detected by the auto-focusing control system 32. This origin is first set for every process and the information is filed as a process offset.

If the exposure of the actual process wafer starts once, the stage reference mark 13a is periodically sent during exposure of the actual wafer (step S10). The focusing measurement is repeated by the detection optical system 27 while changing the focus, similar to the foregoing (steps S11 and S12). The best focus measuring surface is automatically determined (step S14). The offset change amount between the best focusing surface and the focusing origin obtained at the initial time is calculated (step S14). The wafer stage 11 is driven toward the z-direction by the value of the offset change amount, and the offset amount is corrected so that the wafer surface 12a is moved to the best focusing surface of the projection lens 9 (step S15). Conventionally, the change amount of the focus offset is detected during exposure periodically or at a predetermined timing.

It is advantageous in the TTL auto-focusing system shown in FIG. 1 to provide a projection exposure method and a device manufacturing method, whereby a surface to be exposed can be always matched to an in-focusing surface of the projection optical surface at a high precision even under changing characteristics of the projection optical system and fluctuating of a focus position of the projection optical system due to an environmental change or a repetitive exposure, so that a high-integrated device can be simply manufactured. In other words, the focus of the wafer surface is directly detected through the projection lens, so that it is possible to obtain high in-focusing precision for a focus shift of the projection lens, which is caused by a focusing fluctuation of the projection lens with the elapse of time or exposure. Only by printing a pattern merely at the initial time of setting an origin and confirming the focus is the throughput improved, because of unnecessary printing after that. Thereby, a specific mark for detecting focus is unnecessary on the reticle. As long as there is a glass translucent portion that is within 1 mm on the reticle of the actual process, the apparatus is fully able to obtain a signal from the reference mark or the mark on the wafer through the glass translucent portion. Therefore, this method also can be applied to an existing reticle (having no mark for auto-focusing and no opening window portion), and thus, it is capable of necessarily obtaining a focusing state at a high precision. Further, the reticle pattern is always exposed and transferred onto the wafer in the best focusing state, so that it might be possible to reduce the number of defective semiconductors and largely improve the productivity.

FIG. 9 is a block diagram showing an outline of an off-axis wafer alignment system in, for example, a projection exposure apparatus. It is assumed that in the apparatus, the fine reticle alignment (FRA) executes the alignment for a reticle 91 and a projection exposure optical system 92 precisely, and a positional relation (base line) between a projection exposure optical system 92 and off-axis observation optical systems 94 and 107 have been already measured. A wafer 98 is coarsely positioned by a pre-alignment device 96, thereafter, transferred onto an XY stage 100, and held to a wafer chuck 99 on the XY stage 100 by vacuum suction. A pattern printed on the wafer 98, which has been held on the XY stage 100, is captured and sent to an image storage calculating device 93 as an image signal via a microscope 94 and a CCD camera 107. The captured image is collated with the pattern of the alignment mark, which has been stored in the image storage calculating device 93 by pattern matching. If the alignment mark is detected, an offset amount is calculated. By a series of processes, the system is able to accurately detect the positional offset in the plane direction of the wafer 98.

In order to improve the precision of the wafer alignment process, it is necessary to control a gap between the microscope 94 and the wafer 98 on the XY stage 100, namely, a distance between both of them in the Z-axis direction (vertical direction of the wafer) (labeled "focus", hereinafter) and to decrease the influence of a focal point blur (referred to as "defocus", hereinafter) of a pattern as an observing target as much as possible. As for a method of obtaining the best focus by controlling the distance between the microscope 94 and the XY stage 100, there have been hitherto known a method using an auto-focusing mechanism (called an "image AF", later on) by an image process. The image AF will be now described.

In an alignment system shown in FIG. 9, it is assumed that the XY stage 100 can be driven in the Z-axis direction within a range of $Zmin \leq Z \leq Zmax$. The image AF utilizes an estimating function to quantify the blur degree of an image by an image process so as to obtain the most proper height of the XY stage, that is, best focus. In other words, an image signal of a pattern on the wafer 98 is captured through the microscope 94 and the CCD camera 107 while the XY stage 100 is shifted toward the height direction. The estimating function at this time is plotted by the image storage calculating device 93, as shown in FIG. 12. A Zbest of the XY stage 100, which is determined to be the highest estimating value, is set to the best focus. In this case, there has been known a method of using a contrast value which is obtained from the image signal of the pattern captured from the CCD camera 107, as an estimating function. It is possible to prevent the defocus of the alignment mark pattern by conducting the aforementioned image AF process as preparation for the alignment process.

However, recently, in accordance with an increasing demand for a fine pattern and a high integration of a semiconductor device, an LSI device, a VLSI device, etc., an image-formation (projection) optical system having a higher resolution has been needed in the projection exposure apparatus. Corresponding to that, a high NA (numerical aperture) of the image-formation optical system has been developed and thus, the focusing depth of the image-formation optical system is made shallow. Mainly, an ASIC, for example, of a multi-kind and a small-lot has been produced, so that improvement of the throughput has been desired in the projection exposure apparatus.

As factors for displacing the best focus position, there are exemplified, a thermal load due to a change in the elapsed time and exposure, a variation in thickness of the wafer, a suction method thereof, wafer deformation, atmospheric change, temperature change, and the like. By contrast, according to the related art shown in FIG. 3, auto-focusing is performed periodically or at a predetermined timing and, therefore, even if the best focus position at the preceding time is almost matched to that at this time, the best focus position is detected by the first process, second process, or third process. Accordingly, the throughput is diminished in proportion to the process for detecting the best focus position. The system is capable of obtaining almost the same measuring value as that of the best focus position when measuring the measuring value near the best focus position. The auto-focusing measurement is conducted, setting the change amount of the relative position of the stage reference mark in the optical axis for the projection optical system. Accordingly, the throughput is diminished by reason of implementing an unnecessary light amount measurement or a contrast measurement at the relative position of the stage reference mark in the optical axis for the projection optical system at the second and subsequent auto-focusing measurement times, so as to obtain the best focus position.

When obtaining the best focusing value by the aforementioned image AF process, using the device shown in FIG. 9, an image must also be captured repetitively, while the XYZ stage is displaced toward the Z-axis direction by a micro amount at one time. In the case wherein the image AF process is effected for every wafer, a drop in the processing speed might be caused if the number of wafers to be processed is increased. There has been known a method whereby the best focusing value, which has been measured by the image AF at the time of processing a first wafer in the same lot, is stored, and with respect to second and subsequent wafers, the best focusing value, which has been stored, is referred to, and the best focusing value is adjusted by driving the XY stage to the corresponding coordinates, thereby omitting the image AF process for second and subsequent wafers, and preventing a decrease in throughput. However, according to that method, the stored best focusing value might often be invalid when processing a lot of the wafers, whose focuses of patterns on the wafers are varied. For example, if a plurality of wafers, which were processed at a pre-process by different apparatuses are mixed in the same lot, the best focusing values of the patterns formed on the wafers might be different for every wafer. In this case, when using the stored best focusing value as it is, this might cause a problem that the alignment mark is set to defocusing and the precision of the alignment process drops.

SUMMARY OF THE INVENTION

It is an object of the present invention, in view of the problems in the related art, to provide an exposure apparatus and a device manufacturing method, wherein a focus position is preferably maintained and, simultaneously, the throughput due to the measurement of the best focus position is prevented from decreasing.

To attain the objects, according to an aspect of the present invention, an exposure apparatus comprises a movable stage for holding an original plate, focus measuring means for measuring a best focus position by observing a surface of the original plate, while changing a relative position between the original plate surface and an observation optical system toward an optical axis direction of the observation optical system, and control means for controlling the focus measuring means by determining whether the focus measuring means executes the measurement, in accordance with a relation between a value of a specific measuring parameter and a predetermined value thereof.

According to another aspect of the present invention, an exposure apparatus comprises exposing means for exposing, via a projection optical system, a pattern of an original plate onto a substrate, which is placed on a movable stage, focus measuring means for measuring a best focus position during the exposure, by observing a reference mark on the movable stage or a surface of the substrate, while changing a relative position between the movable stage and the projection optical system toward an optical axis direction of the projection optical system, and control means for controlling the focus measuring means by determining whether the focus measuring means executes the measurement, in accordance with a relation between a value of a specific measuring parameter and a predetermined value thereof.

In one preferred form according to this aspect of the present invention, the measuring parameter denotes an elapsed time after a preceding exposure.

In another preferred form according to this aspect of the present invention, the measuring parameter denotes a light amount or a contrast value of an image being observed by the focus measuring means.

According to further another aspect of the present invention, an exposure apparatus comprises exposing means for exposing, via a projection optical system, a pattern of an original plate onto a substrate, which is placed on a movable stage, focus measuring means for measuring a best focus position during the exposure, by observing a reference mark on the movable stage or a surface of the substrate, while changing a relative position between the movable stage and the projection optical system toward an optical axis direction of the projection optical system, and control means for controlling the focus measuring means by determining whether the focus measuring means executes the measurement, based on an elapsed time after the preceding exposure.

In one preferred form according to this aspect of the present invention, if the elapsed time after the preceding exposure is within a range of a preset time, the control means determines that the focus measuring means does not measure the best focus position, and the best focus position, which the focus measuring means measured at a preceding time, is set to the best focus position upon the exposure.

In another preferred form according to this aspect of the present invention, if the elapsed time after the preceding exposure is greater than a range of a preset time, the control means determines that the focus measuring means measures the best focus position.

According to still a further aspect of the present invention, an exposure apparatus comprises exposing means for exposing, via a projection optical system, a pattern of an original plate onto a substrate, which is placed on a movable stage, focus measuring means for measuring a best focus position during the exposure by observing a reference mark on the movable stage or a surface of the substrate, while changing a relative position between the movable stage and the observation optical system toward an optical axis direction of the observation optical system, thereby obtaining predetermined estimating information, and control means for controlling an operation of the focus measuring means by determining whether the focus measuring means measures a best focus position, on the basis of the predetermined estimating information obtained by the focus measuring means at a predetermined timing and estimating information obtained by the focus measuring means at a preceding time.

In one preferred form according to this aspect of the present invention, the estimating information is a value of a light amount or a contrast value, and the control means performs the determination on the basis of a differential between (i) the value of the light amount or a contrast value, which is obtained by the focus measuring means at a best focus position measured by the focus measuring means at the preceding time and (ii) a maximum value of the light amount or contrast value when the focus measuring means measures the best focus position at the preceding time.

In another preferred form according to this aspect of the present invention, when the differential is within a preset range, the control means determines that the focus measuring means does not measure the best focus position, and the best focus position measured by the focus measuring means at the preceding time is set to the best focus position during the exposure.

In a further preferred form according to this aspect of the present invention, when the differential is greater than a preset range, the control means determines that the focus measuring means measures the best focus position.

In still another preferred form according to this aspect of the present invention, when the focus measuring means measures the best focus position in the case wherein the differential is greater than the preset range, the control means determines change positions of the movable stage in the optical axis direction.

In yet a further preferred form according to this aspect of the present invention, the control means determines, as the change positions, several points in front of and behind the focus position obtained by measuring the best focus position by the focus measuring means at the preceding time, including the best focus position itself.

In a further preferred form according to this aspect of the present invention, the control means causes the focus measuring means to measure the light amount or contrast at several points in front of and behind the best focus position obtained by measuring the best focus position by the focus measuring means at the preceding time, and determines the change positions on the basis of the measurement result.

In still a further preferred form according to this aspect of the present invention, the focus measuring means obtains predetermined estimating information indicative of a defocusing degree of an image being observed, when observing the reference mark on the movable stage or the surface of the substrate.

In yet a further preferred form according to this aspect of the present invention, the focus measuring means sets a position, where the defocusing degree of the image being observed is the lowest, to the best focus position during the exposure.

In a still further preferred form according to this aspect of the present invention, the estimating information is a value of a light amount or a contrast value, and the control means causes the focus measuring means to measure the light amount or contrast at several points in front of and behind the best focus position measured by the focus measuring means at the preceding time.

In yet a still further preferred form according to the present invention, when the focus measuring means detects no best focus position in the case wherein the focus measuring means measures the light amount or contrast, the control means causes the focus measuring means to predict the best focus position from a result of measuring the light amount or contrast by the focus measuring means, and the focus measuring means to measure the best focus position on the basis of the prediction.

According to a further aspect of the present invention, an exposure apparatus comprises a movable stage for holding a substrate, an observation optical system for observing a surface of the substrate, focus measuring means for measuring a best focus position of the observation optical system on the basis of an image signal from the surface of the substrate, while changing a relative position between the movable stage and the observation optical system toward an optical axis direction of the observation optical system, and control means for controlling the focus measuring means by determining whether the focus measuring means measures a best focus position, on the basis of a differential between estimating information obtained by the focus measuring means at a predetermined timing and estimating information obtained by the focus measuring means at a preceding time.

In one preferred form according to this aspect of the present invention, the estimating information is a value of a light amount or a contrast value of an image being observed by the focus measuring means.

In another preferred form according to this aspect of the present invention, the control means performs the determination when the substrate, as a target, is one other than a substrate at a head of a lot.

According to still a further aspect of the present invention, a device manufacturing method comprises an exposing step of exposing, through a projection optical system, a pattern of an original plate onto a substrate placed on a movable stage, a focus measuring step of measuring a best focus position during the exposure by observing a reference mark on the movable stage or a surface of the substrate, while changing a relative position between the movable stage and the projection optical system toward an optical axis direction of the projection optical system, and a controlling step of controlling the focus measuring step by determining whether the focus measuring step executes the measurement, on the basis of an elapsed time after a preceding exposure.

According to yet a further aspect of the present invention, a device manufacturing method comprises an exposing step of projecting and exposing, through a projection optical system, a pattern of an original plate onto a substrate placed on a movable stage, a focus measuring step of measuring a best focus position during the exposure by observing a reference mark on the movable stage or a surface of the substrate and obtaining predetermined estimating information, while changing a relative position between the movable stage and the projection optical system toward an optical axis direction of the projection optical system, a controlling step of controlling the focus measuring step by determining whether the focus measuring step measures a best focus position, on the basis of estimating information obtained at a predetermined timing in the focus measuring step and estimating information obtained at a preceding time in the focus measuring step.

According to a still further aspect of the present invention, a device manufacturing method comprises a focus measuring step of observing a best focus position of an observation optical system on the basis of an image signal from a surface of a substrate while changing a relative position between a movable stage for holding the substrate and the observation optical system toward an optical axis direction of the observation optical system; and a control step of controlling the focus measuring step by determining whether the focus measuring step measures a best focus position, on the basis of a differential between estimating information obtained at a predetermined timing in the focus measuring step and estimating information obtained upon measuring the best focus position at a preceding time in the focus measuring step.

BRIEF DESCRIPTION OF THE DRAWINGS

FIGS. 8A and 8B are graphs showing measured waveforms of a light amount or contrast when a focusing change is small and large, respectively, in the operation shown in FIG. 7;

DESCRIPTION OF THE PREFERRED EMBODIMENTS

Figure 1:
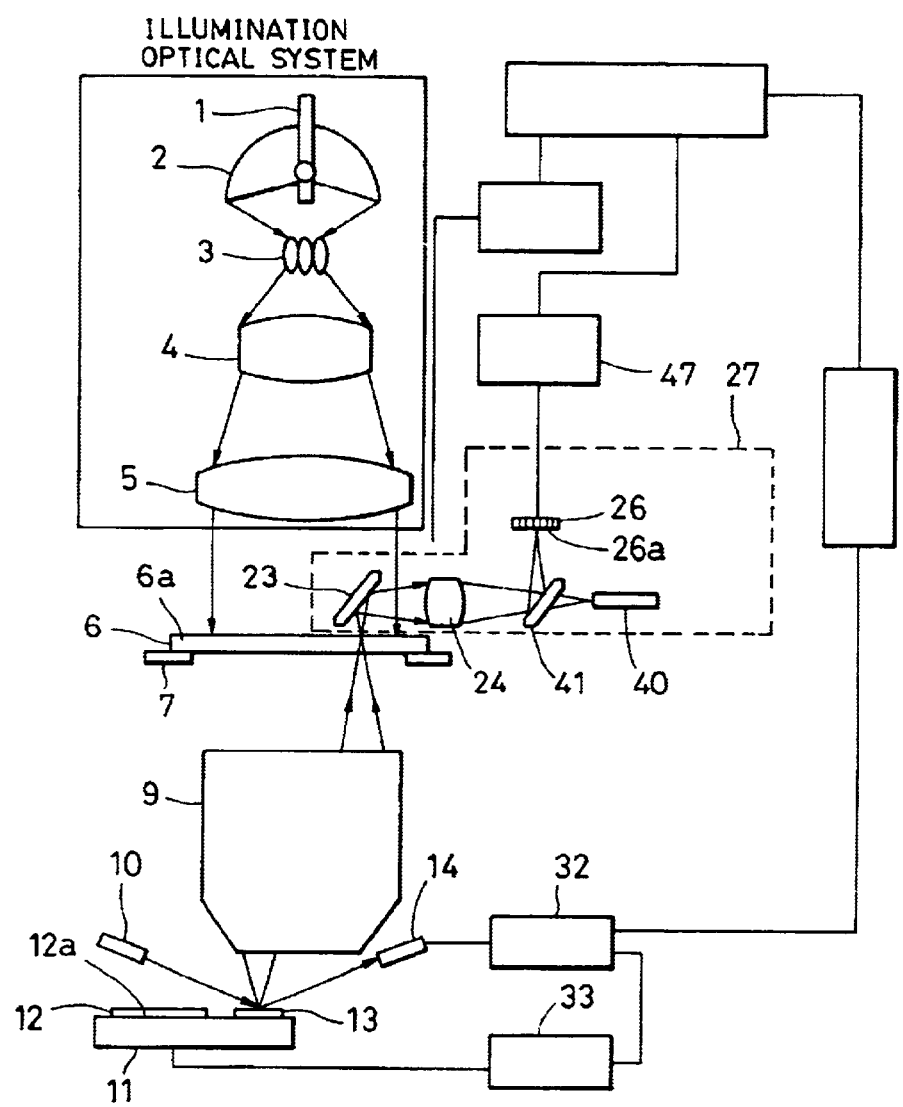
FIG. 1 is a schematic diagram of a projection exposure apparatus having an auto-focusing function according to first to third embodiments of the present invention.
Figure 2:
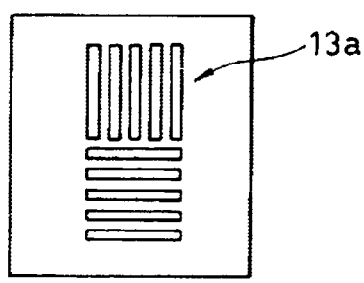
FIG. 2 is an illustrative diagram of a stage reference mark in the apparatus shown in FIG. 1.

FIG. 1 is a schematic diagram of a main portion in an exposure apparatus according to the first embodiment of the present invention. The outline of the exposure apparatus has been described above according to the related art.

Figure 3:
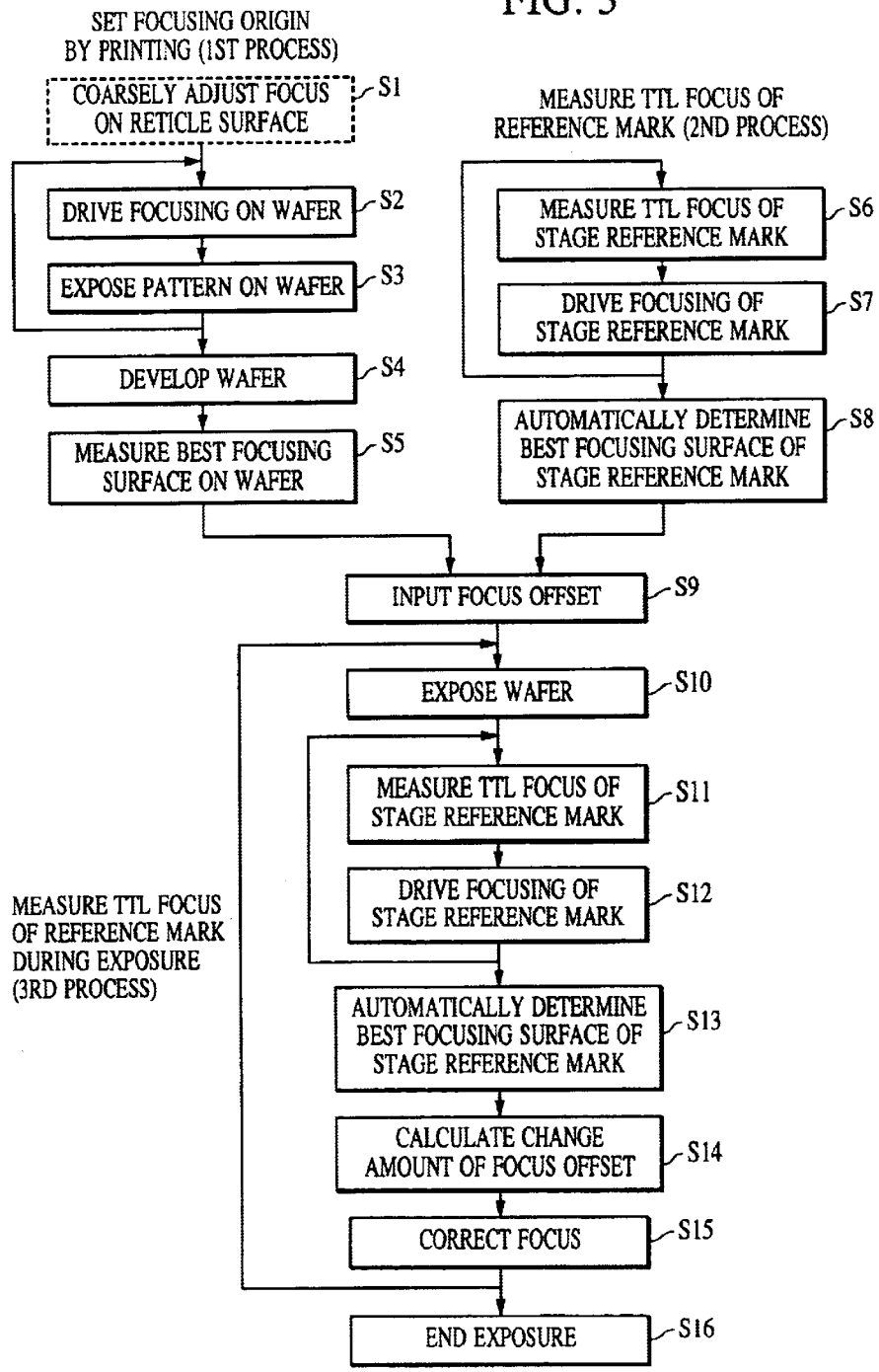
FIG. 3 is a flowchart showing an operation of a projection exposure apparatus having a conventional auto-focusing function.
Figure 4:
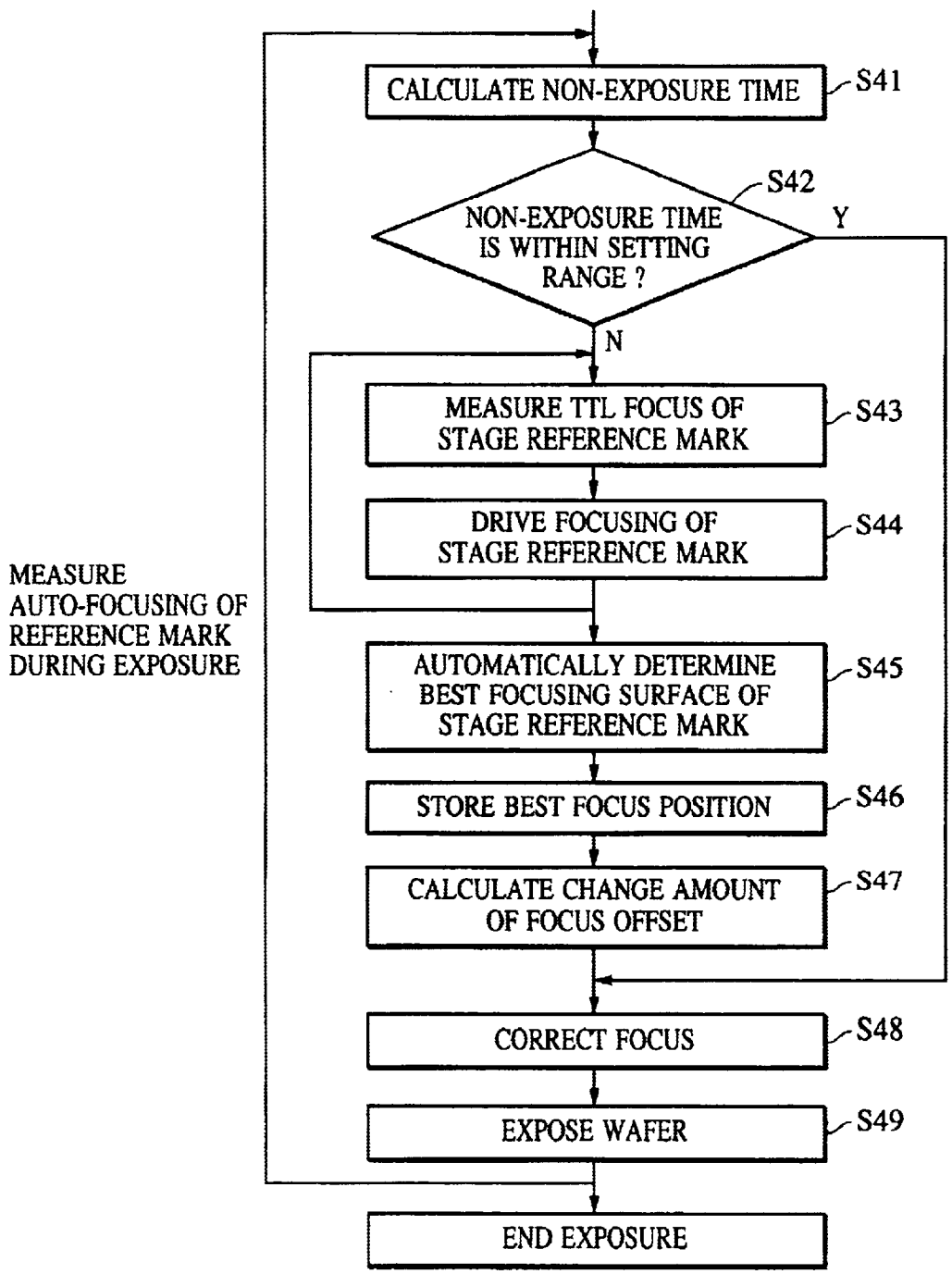
FIG. 4 is a flowchart for an operation according to the first embodiment of the present invention.

FIG. 4 is a flowchart indicative of a processing sequence of the auto-focusing measuring process of a reference mark in an actual wafer exposure (this portion corresponding to the third process according to the related art shown in FIG. 3 in an exposure processing sequence of the exposure apparatus). Referring to FIG. 4, starting the actual wafer exposure process, a non-exposure time is first calculated (step S41). This calculation becomes a factor in discriminating whether or not the auto-focusing measurement is executed. The non-exposure time denotes the elapse of time after the last wafer exposure. If the non-exposure time is within a preset range, the best focusing surface is not automatically determined by the auto-focusing measurement using the stage reference mark 13a, the focus is corrected on the basis of the best focus position stored at the preceding auto-focusing measurement, and the wafer is exposed (steps S42, S48, and S49). If the non-exposure time is greater than the preset range, the best focusing surface is automatically determined by the auto-focusing measurement using the stage reference mark 13a (steps S42 to S45). The best focus position at this time is stored (step S46) and the change amount of the focus offset is calculated (step S47). Based on the calculated change amount of the focus offset, the focus is corrected (step S48). The wafer is exposed (step S49).

Incidentally, the timing of the auto-focusing measurement of the reference mark (not shown in FIG. 4) may be periodic and also determined by setting the non-exposure time as a discriminating reference.

The description now turns to the reason to select the non-exposure time as the discriminating reference of the auto-focusing measurement of the stage reference mark 13a in the present embodiment. As expressed above, as for the factors in the focus offset change, there are exemplified, thermal load due to a change with an elapse of time and exposure, a variation of thickness of the wafer, a suction method thereof, wafer deformation, atmospheric change, temperature change, and the like.

Figure 5A:
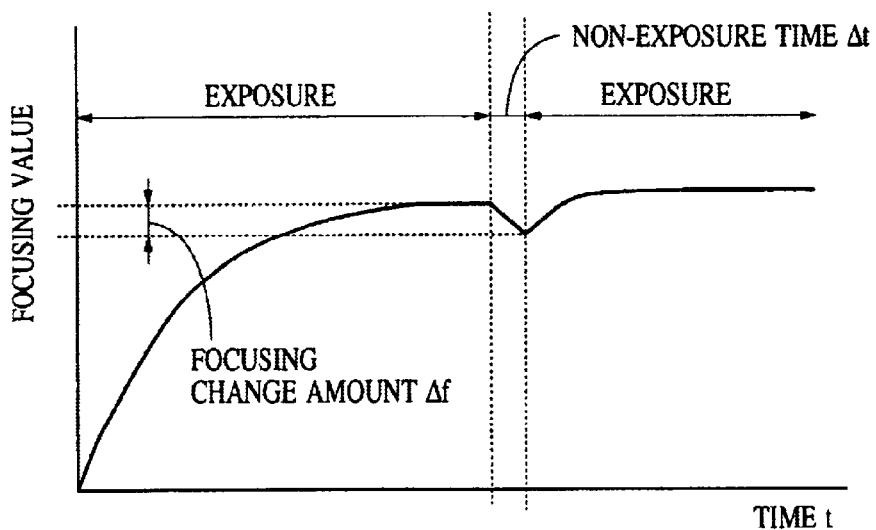
FIGS. 5A and 5B are illustrative diagrams of a focusing change amount when the non-exposure time is short and long, respectively, in the apparatus shown in FIG. 1.
Figure 5B:
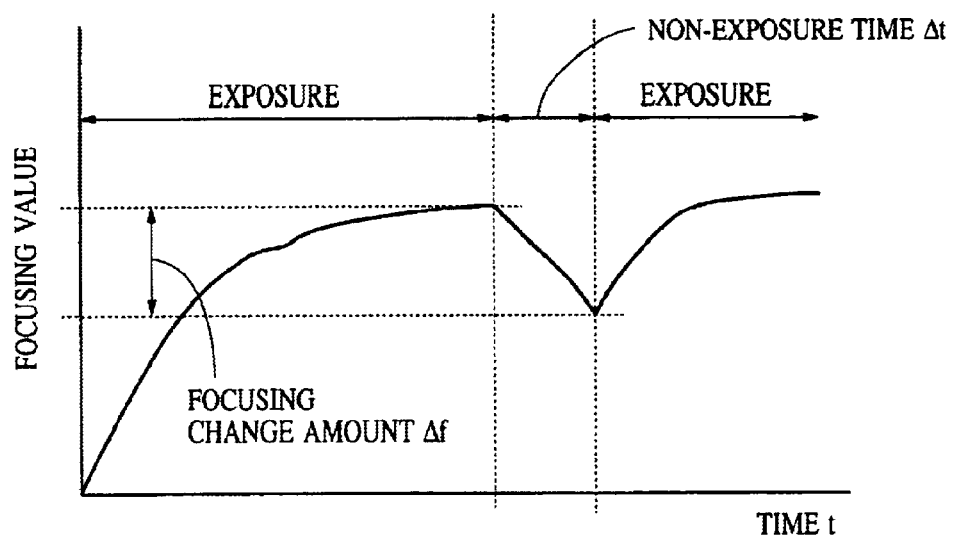

FIG. 5A shows the focusing change when a non-exposure time Δt between the wafer exposure at one time and the next wafer exposure is short. First of all, the exposure causes the change in focusing value. During the non-exposure time Δt, the focusing value is again changed, and this focusing change amount is set to Δf. Since a short non-exposure time Δt might cause a small change amount Δf of the focusing value between the focusing value at the end of the exposure and the focusing value at the start of the next exposure, it is possible to expose the wafer without an auto-focusing measurement to correct the origin displacement amount between the aforementioned actual best exposing focus and the best focusing surface detected by the auto-focusing control system 32. Contrarily, FIG. 5B shows the focusing change when the non-exposure time Δt is long. In this case, a long non-exposure time Δt might cause a large focusing change amount Δf. Therefore, when exposing the wafer after an elapse of the non-exposure time Δt, the auto-focusing measurement is performed to correct the origin displacement amount between the aforementioned actual best exposing focus and the best focusing surface detected by the auto-focusing control system 32.

In the present embodiment, as mentioned above, the preset time is compared with the non-exposure time Δt. If the non-exposure time Δt is greater than the preset time, the best focusing surface is automatically determined by the auto-focusing measurement of the stage reference mark. If the non-exposure time Δt is within the preset time, the apparatus is controlled not to automatically determine the beat focusing surface by the auto-focusing measurement of the stage reference mark.

By controlling the process to automatically determine the best focusing surface by the auto-focusing measurement by the stage reference mark as shown in the present embodiment, the device is able to omit an unnecessary process in the case in which the focusing change is small in accordance with the wafer exposure, and thus, able to improve the total throughput.

Note that the user or the like may arbitrarily designate the preset time to control the process to automatically determine the best focusing surface by the auto-focusing measurement of the stage reference mark, and the preset time also may be automatically set, based on the exposure time stored so far, the exposure amount, etc.

Figure 6:
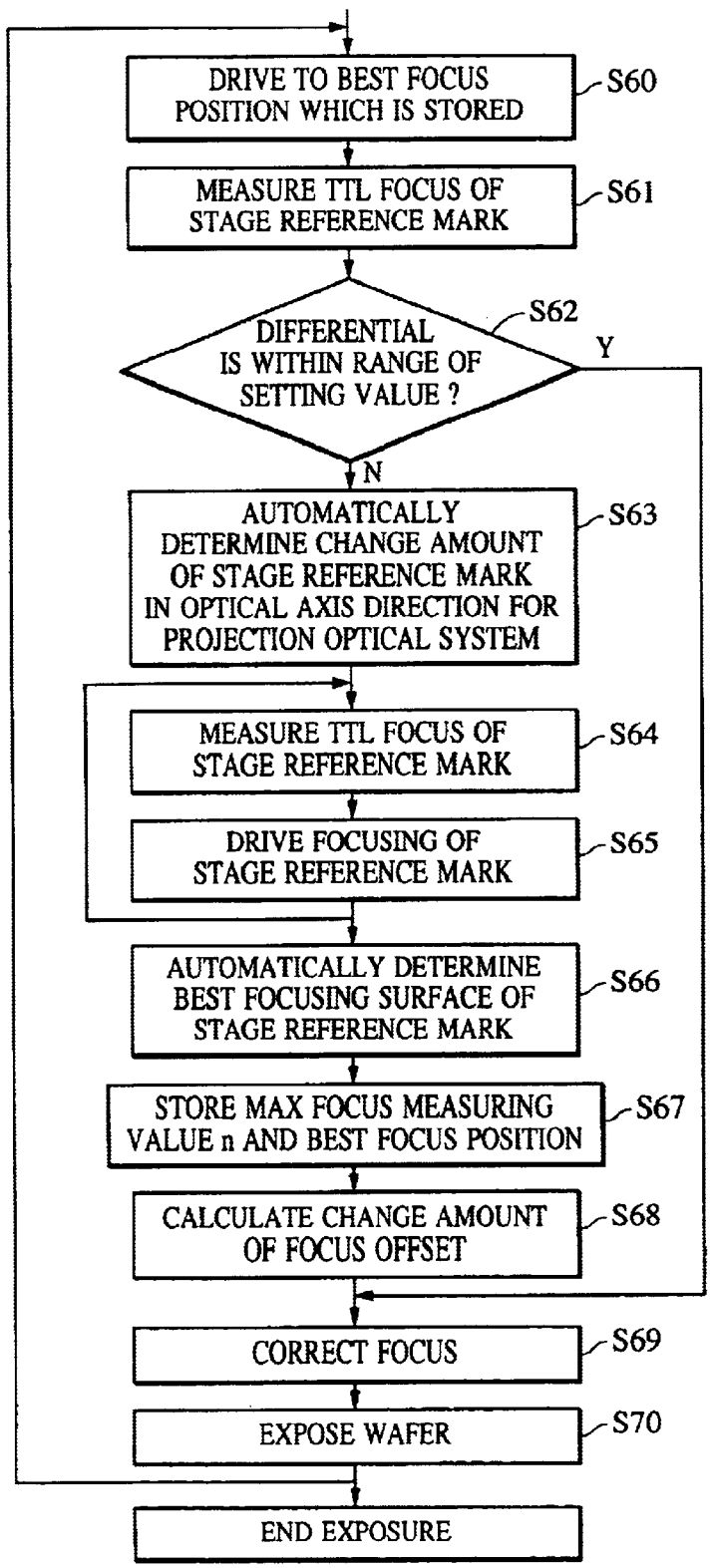
FIG. 6 is a flowchart for an operation according to the second embodiment of the present invention.

Next, the description turns to a processing sequence according to a second embodiment of the present invention with reference to a flowchart shown in FIG. 6. Starting the actual wafer exposure process, the focus position is first driven to the best focus position, which was stored at the preceding auto-focusing measurement (step S60). At that time, if there is no best focus position that was stored (not shown in FIG. 6), that is, the auto-focusing measurement has never been executed once, the auto-focusing measurement is initially executed. Successively, the focus is measured once at the preceding best focus position by using the detection optical system 27 and transmitting the stage reference mark 13a (step S61). Both the measurement of the light amount and the measurement of contrast suffice as the focusing measurement in this case. A differential is calculated between the focus measuring value at the first time in step S61 and a maximum focus measuring value n, which was stored at the preceding auto-focusing measurement. If the differential is within the preset range, the auto-focusing measurement is not conducted by the stage reference mark 13a at this time, only the focusing correction is executed by using the value of the focus position which was stored, and thereafter, the wafer is exposed (steps S62, S69 and S70). If the differential is greater than the preset range, the change amount of the stage reference mark 13a in the optical axis direction for the projection optical system is automatically determined (steps S62 and S63). The stage reference mark is auto-focusingly measured (steps S64 and S65), and the best focusing surface of the stage reference mark is automatically determined (step S66).

With regard to the method of determining the change amount of the stage reference mark 13a in the optical axis direction for the projection optical system in step S63, it is sufficient to use a fixed change amount unconditionally similar to the related art, for several points (within (n−m) to (n+m), where m: arbitrary value) in front of and behind the stored best focus position as a reference, and a necessary and minimum change amount whereby the best focus position can be detected in accordance with the differential amount calculated in step S62.

After automatically determining the best focusing surface by the auto-focusing measurement of the stage reference mark 13a, the maximum focus measuring value n at this time and the best focus position are stored (step S67). Next, the change amount of the focus offset is calculated (step S68). Based on this value of the calculation, the focus is corrected and the wafer stage 11 is transferred to the best focusing surface of the projection lens 9 (step S69). Thereafter, the wafer is exposed (step S70).

It is to be noted that, although not shown in FIG. 6, in the present invention, a conventionally periodic timing for and a timing every wafer process suffice for the execution timing of measuring the focus once at the best focus position in step S61. The execution timing also may be determined by combining the first embodiment and the like.

According to the present embodiment, only when the change in focus is large, is the best focusing surface detected by the TTL focusing measurement of the stage reference mark, so that the total throughput is able to be improved.

Figure 7:
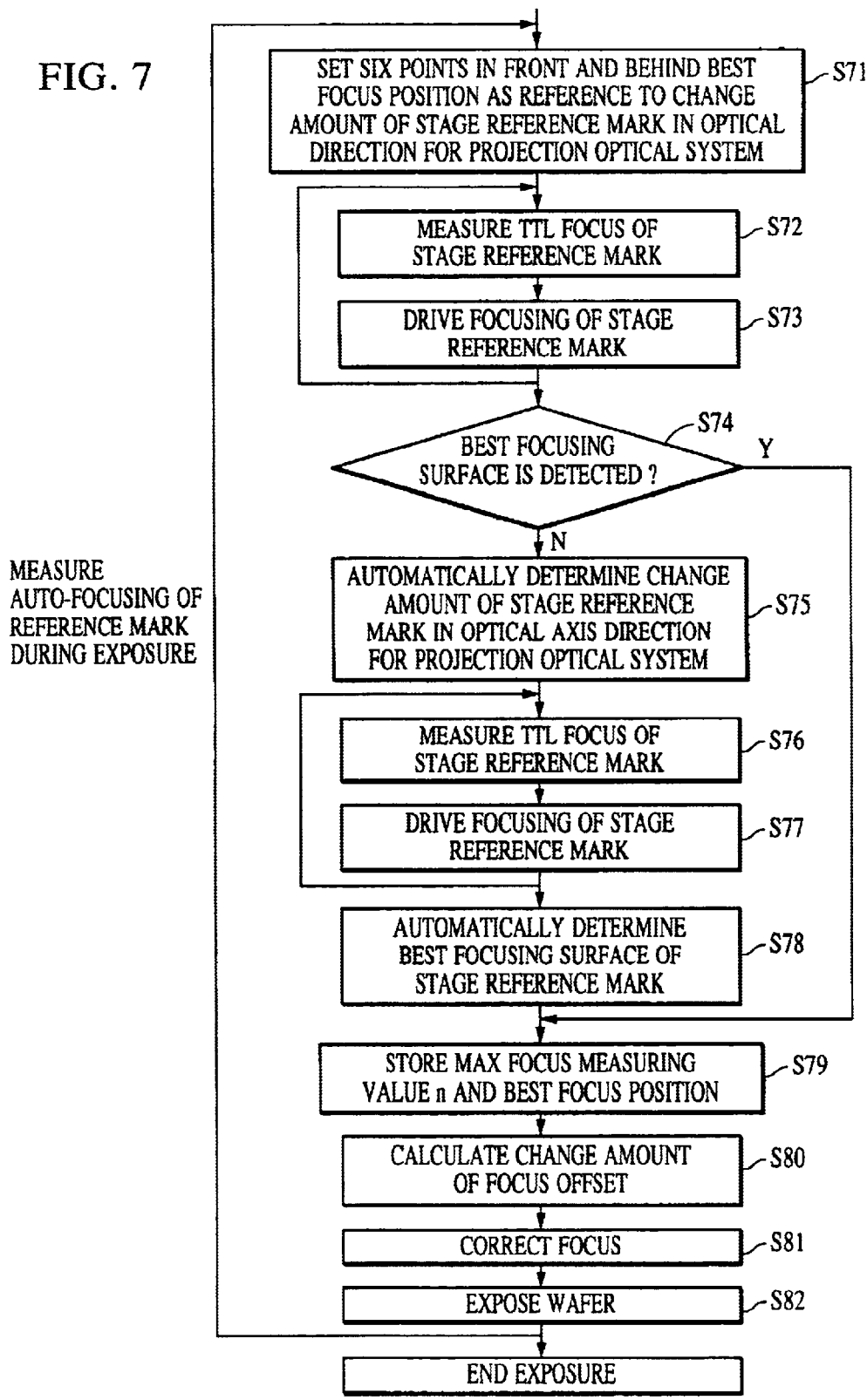
FIG. 7 is a flowchart for an operation according to the third embodiment of the present invention.

The description now turns to a processing sequence according to a third embodiment of the present invention, with reference to a flowchart shown in FIG. 7. Starting the actual wafer exposure process, several points (within (n−m) to (n+m), where m is an arbitrary value and is assumed to be "6", herein) in front of and behind the best focus position stored at the preceding auto-focusing measurement as a reference are set to a change amount of the stage reference mark 13a in the optical axis direction for the projection optical system (step S71). In other words, a total of thirteen points are focusingly-measured here. Based on this setting, a TTL focus of the stage reference mark 13a is measured (steps S72 and S73). If the best focusing surface is detected, a maximum focus measuring value n at this time and the best focus position are stored (steps S74 and S79). If the best focusing surface is not detected, the change amount of the stage reference mark 13a in the optical axis direction for the projection optical system is automatically determined so as to detect the best focusing surface (steps S74 and S75).

The description now turns to a method of automatically determining the change amount of the stage reference mark 13a in the optical axis direction for the projection optical system, with reference to FIGS. 8A and 8B. Referring to FIG. 8A, the best focus position stored at the preceding auto-focusing measurement is set to "0" μm. A maximum focus measuring value is equal to "849" in this case. In the case of an auto-focusing measurement at the this time, the focusing measurement is performed at the total thirteen points including six points in front of and behind the stored best focus position with "0" as a reference, and the best focus position itself. If the range of the focusing measurement is within the above-mentioned range, as shown in FIG. 8A, the auto-focusing measurement is executed, including the best focus position if the best focus position at this time exists temporarily both in the "+" direction and in the "−" direction. Referring to FIG. 8B, even if the best focus position is changed largely as compared with that at the preceding auto-focusing measurement and the best focus position is not detected in the focusing measurement of the foregoing total thirteen points, it is possible to predict, on the basis of the result of the focusing measurement at the thirteen points, in which direction of the optical axis direction of the stage reference mark 13a for the projection optical system the best focus position exists. The change amount may be set so that the maximum focus measuring value can be measured in accordance with the prediction.

Next, the stage reference mark 13a is auto-focusingly measured (steps S76 and S77). The best focusing surface of the stage reference mark 13a is automatically determined (step S78). After automatically determining the best focusing surface of the stage reference mark, the maximum focus measuring value n and the best focus position are stored (step S79). The change amount of the focus offset is calculated (step S80). Based on the calculated change amount, the focus is corrected and the wafer stage 11 is transferred to the best focusing surface of the projection lens 9 (step S81) and the wafer is exposed (step S82).

Although not shown in FIG. 7, in the present embodiment, a conventionally periodic timing and a timing for every wafer process suffice for the execution timing of the focusing measurement at several points in front of and behind the best focus position as a reference. The execution timing also may be determined by combining the first and second embodiments, and the like.

According to the present embodiment, it is possible to set, to a necessary and minimum level, the change amount of the stage reference mark 13a to detect the best focusing surface in the optical axis direction for the projection optical system at the auto-focusing measurement. Thus, the throughput can be improved.

Figure 9:
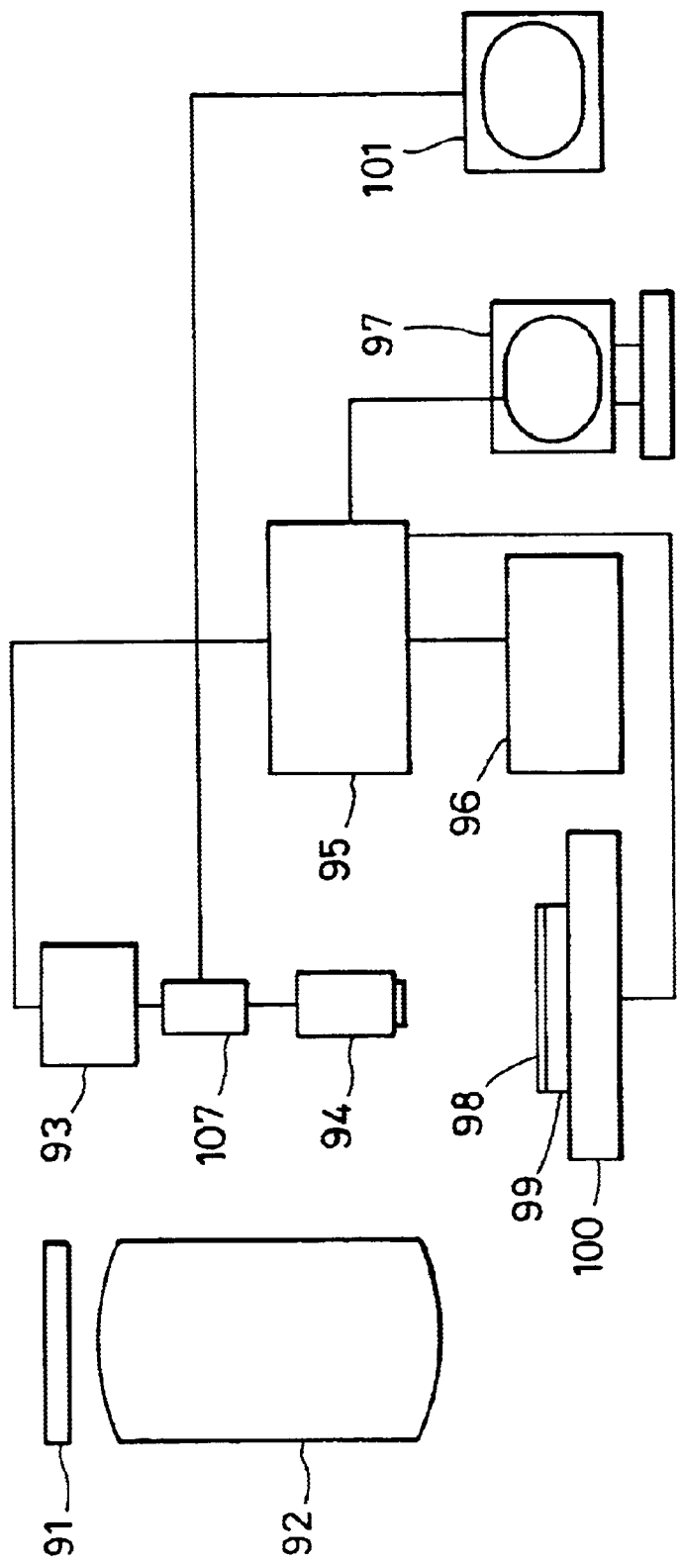
FIG. 9 is a block diagram showing an outline of an alignment system in a semiconductor exposure apparatus according to the fourth embodiment of the present invention.

FIG. 9 is a block diagram showing an outline of a wafer alignment system based on an off-axis method in a semiconductor exposure apparatus according to a fourth embodiment of the present invention. The alignment system comprises: a reticle 91; a projection exposure optical system 92; an image storage calculating device 93 having functions for executing a variety of image calculating processes for an inputted image signal and means for storing the image signal and the calculating process result; a pre-alignment device 96 for coarsely adjusting the direction of the wafer when the wafer is transferred from a wafer transfer device (not shown); a computer terminal 97 for receiving a command input for the operation; a wafer 98 as an alignment target; a microscope 94 for enlarging an image of a pattern formed on the wafer 98; a CCD camera 107 for converting the image of the pattern formed on the wafer 98, which is obtained through the microscope 94, into an electrical signal and inputting the signal to the image storage calculating device 93; an XY stage 100 for moving the coordinate position of the wafer 98 toward a plane direction and a vertical direction; a wafer chuck 99 for holding the wafer 98 on the XY stage 100; a monitor 101 as display means by which the operator directly confirms the image of the microscope 94; a central processing unit (CPU) 95 for controlling the aforementioned devices. The microscope 94 and the CCD camera 107 are labeled as an off-axis observation optical system. In this system, the reticle 91 and the projection exposure optical system 92 are precisely positioned by the FRA method or the like. It is assumed that a relative positional relationship (base line) between the projection exposure optical system 92 and the off-axis observation optical system (microscope 94 and CCD camera 107) has been already measured.

The operation of the devices shown in FIG. 9 will be described below. The wafer 98 is coarsely positioned by the pre-alignment device 96, thereafter, transferred onto the XY stage 100, and held by vacuum suction by the wafer chuck 99 on the XY stage 100. The pattern printed on the wafer 98, held on the XY stage 100, is captured as an image signal via the microscope 94 and the CCD camera 107. A pattern of the alignment mark stored in the image storage calculating device 93 is collated with the captured image by pattern matching, and a displacement amount is calculated when detecting the alignment mark. A series of the processes results in enabling the detection of the positional offset in the wafer plane direction for the off-axis observation optical system. Based on the base line amount and the measuring value measured by the FRA, it is possible to obtain the relative offset amount between the wafer 98 and the reticle 91.

The image storage calculating device 93 has a function for calculating an estimating value indicative of the degree of blur of the image signal captured, for example, the contrast of the image signal and for storing the contrast value. The contrast herein denotes a value denoted by a differential between a maximum luminance and a minimum luminance in an image signal. As long as the estimating value denotes an index indicative of the blur degree of the image signal, a value instead of the contrast value may be used. Obviously, the CPU 95 may implement the calculation process and storage process, which the image storage calculating device performs.

The XY stage 100 can be driven in the direction perpendicular to the wafer surface (referred to as a Z-direction within $Zmin \leq Z \leq Zmax$. In order to suppress defocusing influence of the alignment mark, the XY stage 100 is driven in the Z-direction and the Z-direction of the wafer 98 is controlled. If a position of the microscope 94 in the Z-direction can be shifted, this may be used as focus control means. The present embodiment includes the description of the image AF process to obtain the best focus by controlling a distance of the XY stage 100.

Figure 10:
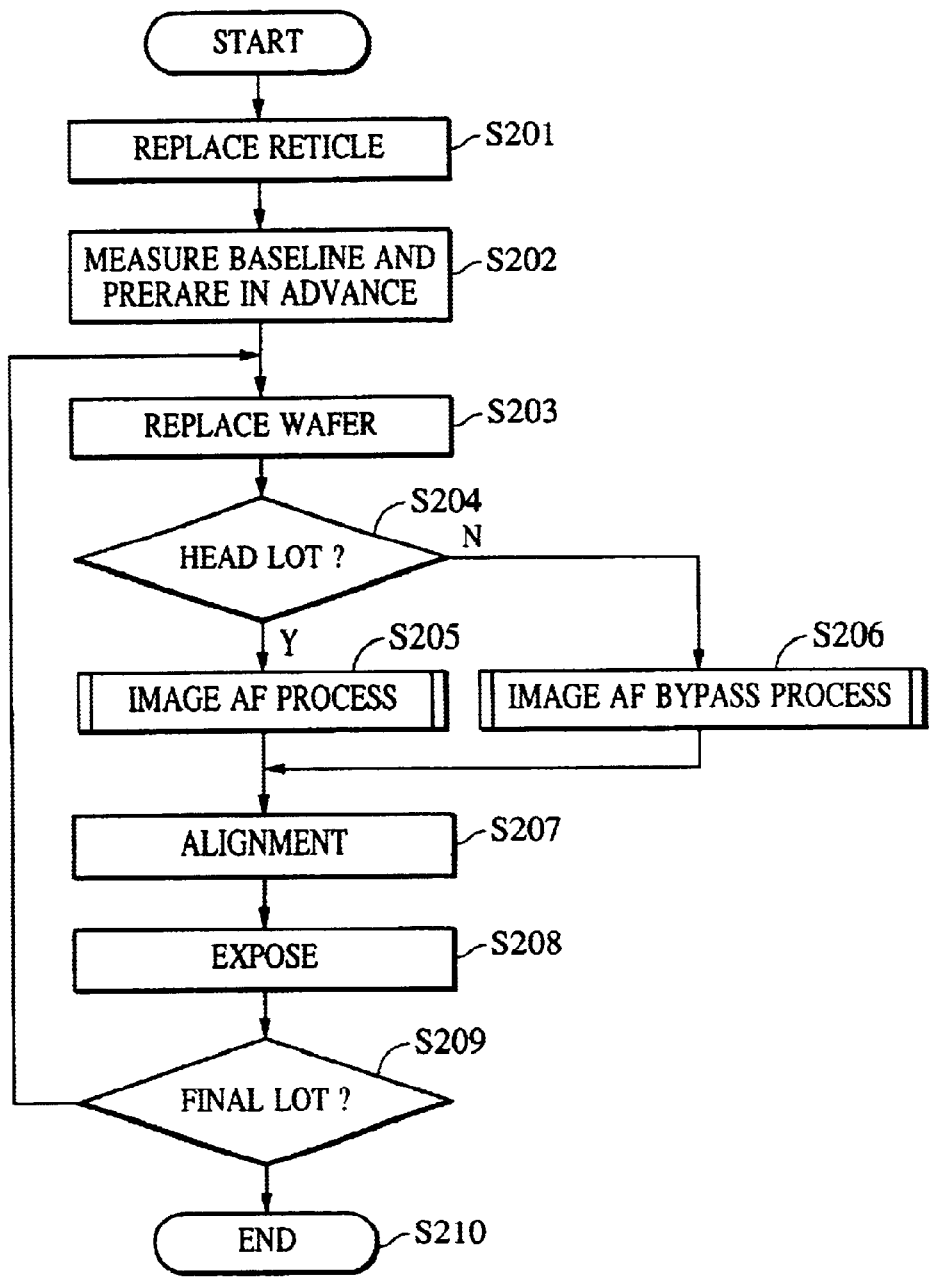
FIG. 10 is a flowchart showing a processing flow for the apparatus shown in FIG. 9.

FIG. 10 is a flowchart showing a processing flow of the system shown in FIG. 9. As shown in FIG. 10, starting the process, a reticle is first replaced in step S201. Here, the relative positional relationship between the projection exposure optical system 92 and the reticle 91 is measured by the FRA or the like. Next, preparation is executed in advance for the base line measurement and calibration measurement for an offset value occurred by a device factor, for example, in step S202. The processes in steps S203 to S209 are repeated until ending the process for the wafer to be processed in the lot.

A wafer replacing process to transfer the wafer to be processed to the wafer stage by a wafer transfer device (not shown) is executed in step S203. Next, based on discriminating whether or not the wafer, which is being processed at present, is a wafer that is to be processed after the reticle replacement for the first time (that is, whether or not the wafer is at the head of the lot), the processes are distributed in step S204. If the wafer, which is being processed, is the wafer that is first processed after reticle replacement, the processing routine advances to step S205. If the wafer, which is being processed, is a second or subsequent wafer, the processing routine advances to step S206.

The image AF process of the alignment mark formed on the wafer is performed in step S205. It is discriminated whether or not the image AF process is implemented and, if the image AF process is unnecessary, it is not implemented, in step S206. Incidentally, the processes in steps S205 and S206 will be discussed in detail later on.

After finishing the image AF process of the alignment mark, the corresponding wafer is subjected to an alignment process in step S207. A pattern of the reticle is exposed to all of the shot areas of the corresponding wafer in step S209. Successively, it is checked to see if a wafer to be processed remains in one lot, in step S209. If there is a wafer yet, the processing routine returns to step S203, a new wafer is loaded and the process is continued. If there is no remaining wafer, the process ends in step S210.

The description now turns to the image AF process in step S205 and the image AF bypass process in step S206.

Figure 11:
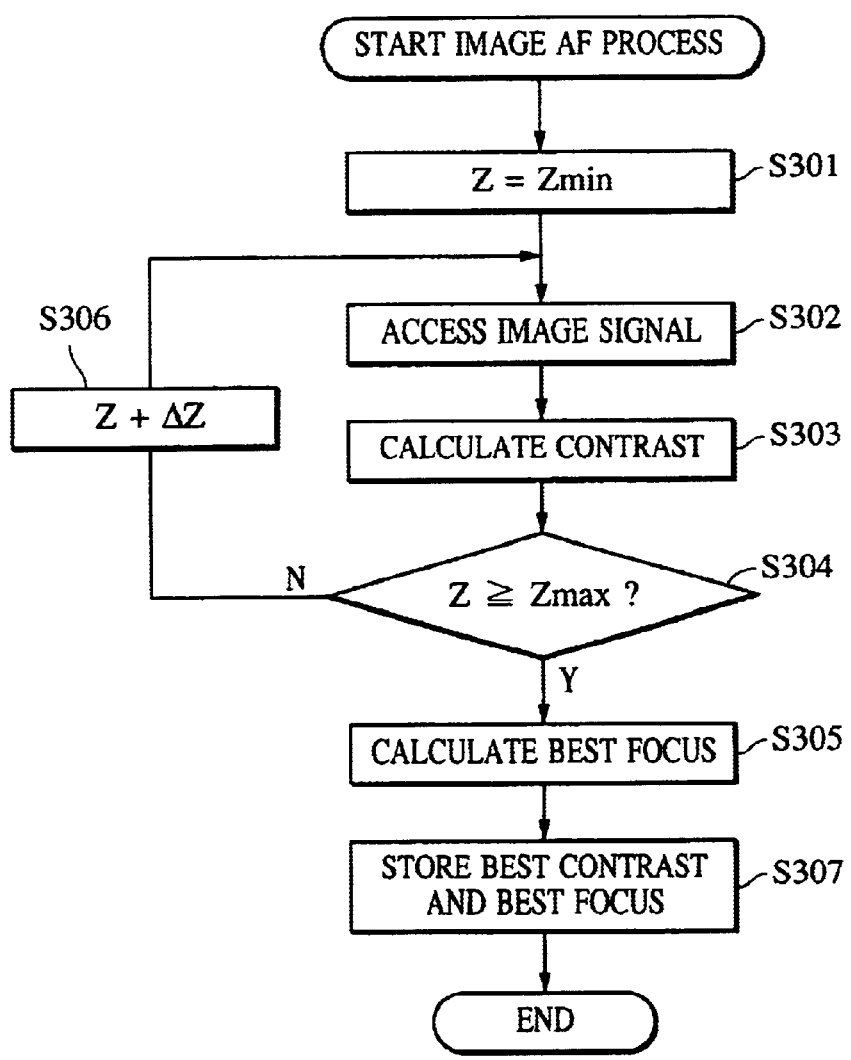
FIG. 11 is a flowchart showing a flow of an image AF process in the flowchart shown in FIG. 10.

FIG. 11 is a flowchart showing a flow of the image AF process in step S205. Starting the process, a Z position Zi of the XY stage 100 is set to a minimum value Zmin within a drivable range and the XY stage 100 is driven to Zmin, in step S301. Next, the CCD camera 107 captures image signals of the alignment mark formed on the wafer, in step S302. A contrast value Ci at the position Zi is calculated from among the captured image signals in step S302 and the contrast value Ci is stored to the image storage device.

The operation discriminates whether or not the Z-position value of the XY stage 100 can be increased by a micro-driving-amount ΔZ from the present position value, in step S304. If the Z-position value, which might be increased by ΔZ, is more than a maximum drivable value Zmax, the processing routine advances to step S305. If the Z-position value, which might be increased by ΔZ, is not more than the maximum drivable value, the Z-position value is increased by ΔZ, in step S306, the XY stage 100 is driven, the processing routine returns to step S302, and the foregoing processes are repeated.

Figure 12:
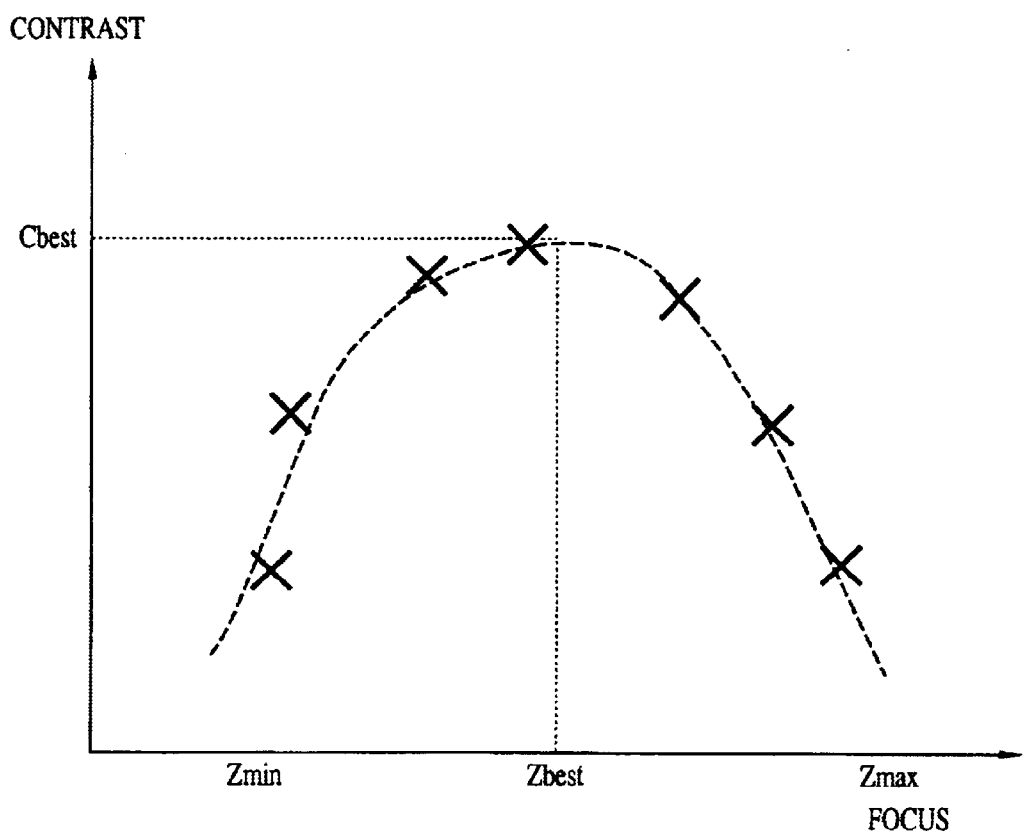
FIG. 12 is a graph showing a relationship between a focus position and contrast in the process shown in FIG. 11.

Based on the correspondence between the Z-position values stored in step S303 and the contrast values at the Z-positions, a value of the Z-position, at which it can be determined that the (alignment mark) image is most fine, namely, a best focus position, Zbest, is calculated in step S305. If, for example, the Z-position values and contrast values are plotted as shown in FIG. 12, it is sufficient to use, as the best focus position, a Z-position at which the measured contrast value becomes maximum. If a peak of the contrast is obtained by curve-approximating the plotted values by a Lagrangian interpolation method or the like, the best focus position can be calculated more accurately.

The best focusing value Zbest and the peak value Cbest of the contrast, which have been calculated in step S305, are stored in step S307. Those values are referred to in the image AF process for the second and subsequent wafers, in step S206.

Figure 13:
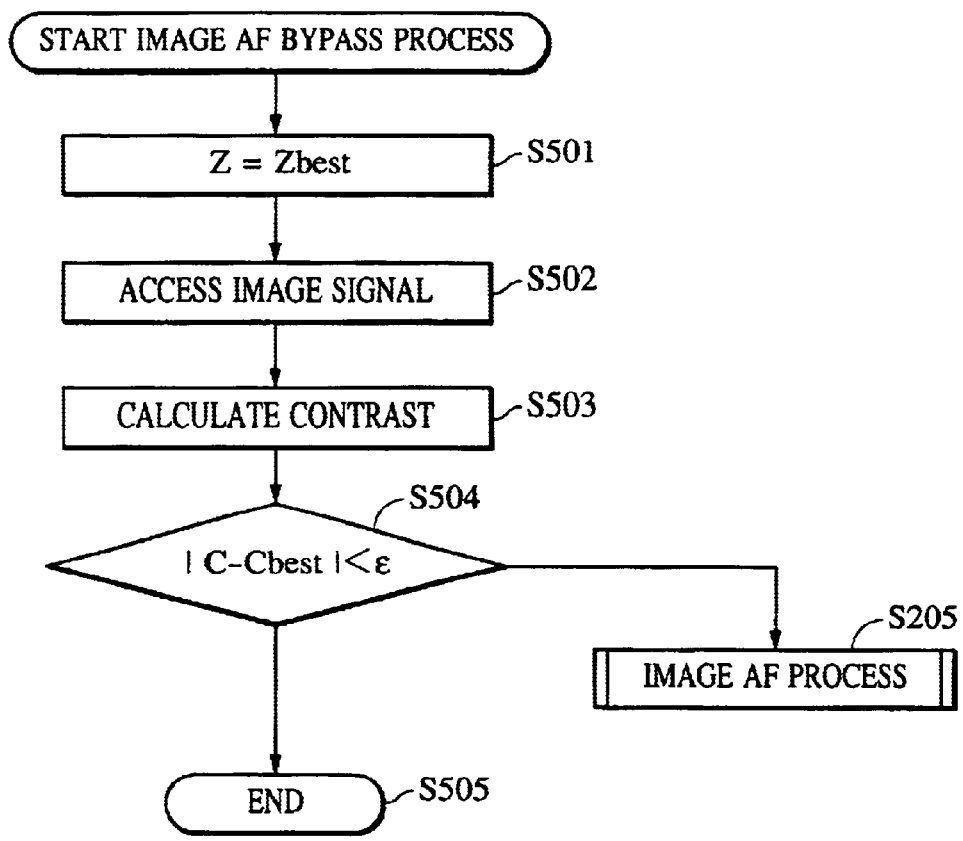
FIG. 13 is a flowchart showing a flow of an image AF bypass process in the process shown in FIG. 10.

FIG. 13 is a flowchart showing a flow of the image AF bypass process, in step S206 shown in FIG. 10. First, the Z-position Zi of the XY stage 100 is set to the best focus position value Zbest, thereby driving the stage position, in step S501. The CCD camera 107 captures image signals of the alignment mark formed on the wafer, in step S502. In step S503, the contrast value Ci at the present focus position Zi is calculated from among the image signals captured, in step S502.

The value of Ci, calculated in step S503, is compared with the best contrast value Cbest stored at the former time in step S504. If Ci is almost close to Cbest, it is determined that it is sufficient to set the focusing value Zi at that time (at the former time) to a new best focusing value, and the image AF bypass process ends, in step S505. If a differential between values Ci and Cbest is large, the processing routine advances to step S205, thereby implementing the image AF process and re-calculating the best focusing value anew.

By storing the best focusing value and the contrast (best contrast) value at the time of the best focus, which have been calculated by the image AF measurement at the time to process the wafer in the head of the lot and referring to the best focusing value and the best contrast value, which were measured, at the time for processing the second and subsequent wafers, the image capturing process is executed only once, thereby enabling the discrimination about whether or not the image AF process is implemented.

The above-stated processes enable the improvement of the total throughput by the following functions. That is, under the condition of a uniform processing state, in all processes of the wafers existing in the same lot and a small variation in step-differences of the alignment mark formed on the wafer, there are increased cases in which the image AF process can be omitted for the second and subsequent wafers by the image AF bypass process in step S206, thereby improving the processing speed. Further, even if the step-differences of the alignment mark formed on the wafer are depended upon a wafer, it is possible to automatically detect the need to perform the image AF process for the wafer during processing, because the contrast values have been compared in step S206. Therefore, the operation is capable of always setting the proper focusing value, even for the wafers whose best focusing values have variations.

Note that although it is advantageous to apply the present invention to the usage of the image AF process of the alignment mark formed on the wafer according to the present invention as discussed above, obviously, it is also possible to apply the method of the present invention to the usage of the image AF process of the reticle pattern and the reference mark formed on the XY stage.

Although the so-called stepper is exemplified in the present invention, the present invention also can be applied to a scanner.

The description now turns to an embodiment of a device manufacturing method using the aforementioned exposure apparatus.

Figure 14:
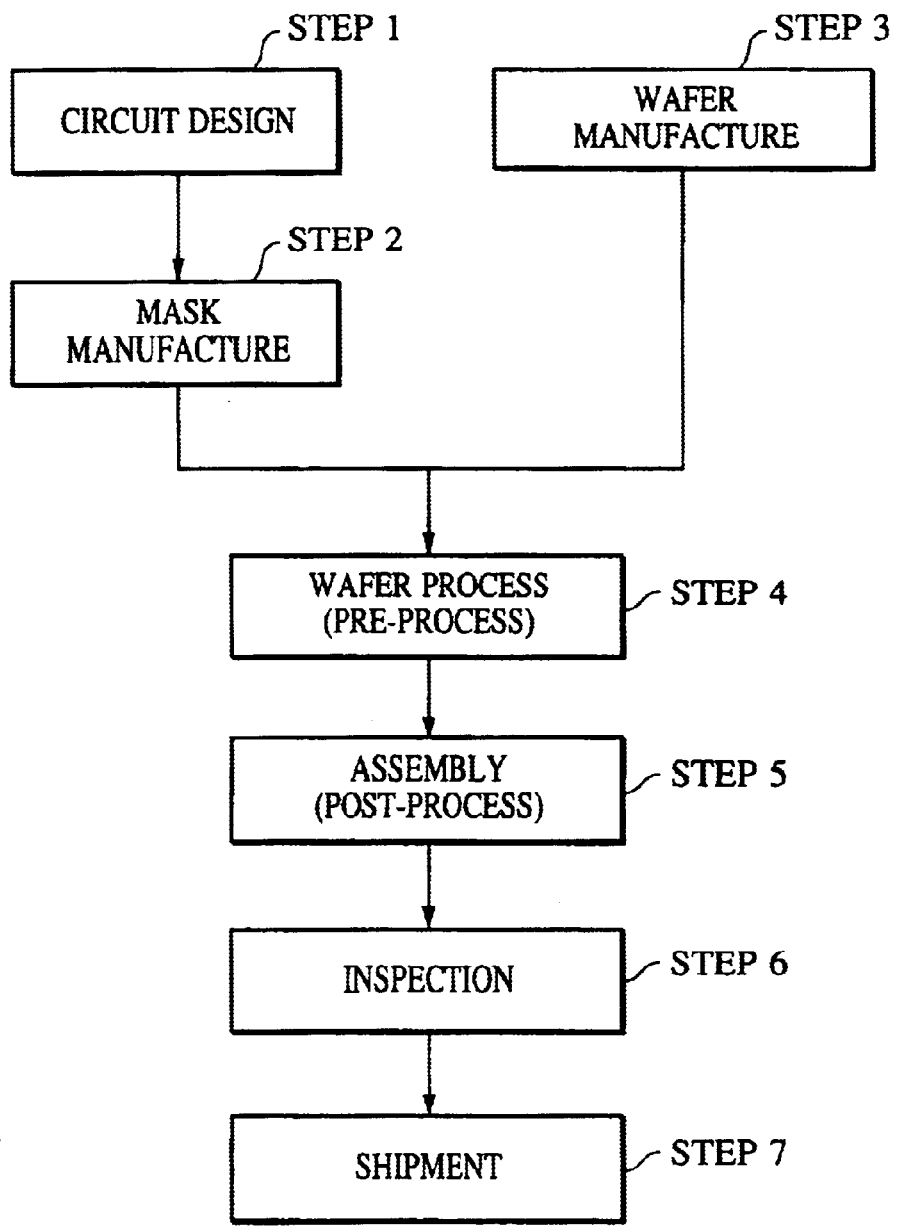
FIG. 14 is a flowchart showing a device manufacturing method capable of using an exposure apparatus according to the present invention.

FIG. 14 is a flowchart showing a process for manufacturing a micro-device (e.g., a semiconductor chip such as an IC or an LSI, a liquid crystal panel, a CCD (charge-coupled device), a thin film magnetic head, a micro-machine or the like). At step 1 (circuit design), the circuit design of the semiconductor device is effected. At step 2 (the manufacturing of a mask), a mask, as a substrate described in the above embodiments, formed with the designed circuit pattern, is manufactured. On the other hand, at step 3 (manufacturing of a wafer), a wafer is manufactured by the use of a material such as silicon. Step 4 (wafer process) is called a pre-process, in which by the use of the manufactured mask and wafer, an actual circuit is formed on the wafer by lithography techniques. The next step, step 5 (assembling), is called a post-process, which is a process for making the wafer manufactured at step 4 into a semiconductor chip, and includes steps such as an assembling step (dicing and bonding) and a packaging step (enclosing the chip). At step 6 (inspection), inspections such as an operation confirming test and a durability test of the semiconductor device manufactured at step 5 are carried out. Via such steps, the semiconductor device is completed, and it is delivered (step 7).

Figure 15:
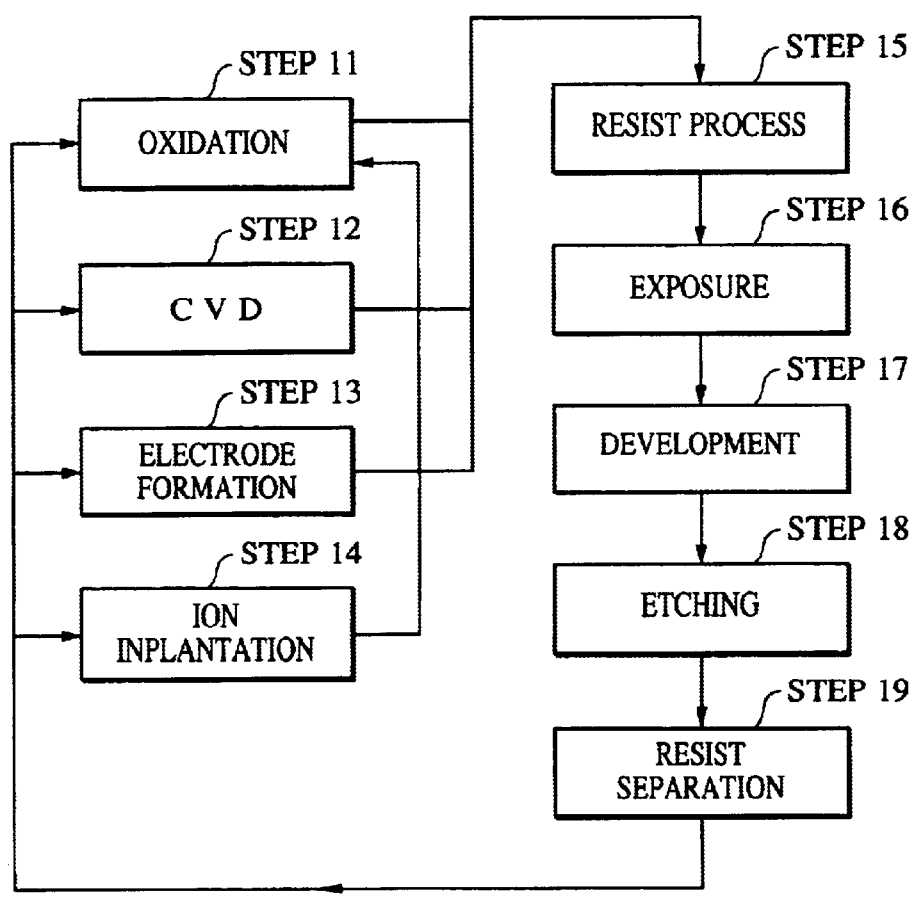
FIG. 15 is a flowchart showing details of a wafer process shown in FIG. 14.

FIG. 15 is a flowchart showing the detailed steps of the wafer process discussed above with respect to step 4. At step 11 (oxidation), the surface of the wafer is oxidized. At step 12 (chemical vapor deposition—CVD), an insulating film is formed on the surface of the wafer. At step 13 (the forming of an electrode), an electrode is formed on the wafer by vapor deposition. At step 14 (ion implantation), ions are implanted into the wafer. At step 15 (resist processing), a photo-resist is applied to the wafer. At step 16 (exposure), the circuit pattern of the mask is printed and exposed onto the wafer by the exposure apparatus. At step 17 (development), the exposed wafer is developed. At step 18 (etching), the portions other than the developed resist image are removed. At step 19 (the peeling-off of the resist), the resist, which has become unnecessary after the etching, is also removed. By repetitively carrying out these steps, circuit patterns are multiplexly formed on the wafer. If the manufacturing method of the present embodiment is used, it will be possible to manufacture semiconductor devices having a high degree of integration, which have heretofore been difficult to manufacture.

Except as otherwise disclosed herein, the various components shown in outline or in block form in the figures are individually well known and their internal construction and operation are not critical either to the making or using of this invention or to a description of the best mode of the invention.

While the present invention has been described with respect to what is at present considered to be the preferred embodiments, it is to be understood that the invention is not limited to the disclosed embodiments. To the contrary, the invention is intended to cover various modifications and equivalent arrangements included within the spirit and scope of the appended claims. The scope of the following claims is to be accorded the broadest interpretation so as to encompass all such modifications and equivalent structures and functions.

According to the present invention, the implementation of the focusing measurement is controlled on the basis of the discrimination about whether or not a specific measuring parameter is more than a predetermined value, or the implementation of the best focus position measurement is controlled on the basis of the elapsed time after the preceding projection exposure. Alternatively, the implementation of the best focus position measurement is controlled on the basis of the estimating information obtained at a predetermined timing, such as contrast, and the estimating information upon measuring the best focus position at the preceding time. Consequently, the focusing precision is maintained preferably by performing the best focus measurement as the necessity may arise. It is also possible to prevent an unnecessary best focusing measurement. Therefore, not only can the focusing precision can be maintained preferably, but also, the throughput can be improved.

What is claimed is:

1. An exposure apparatus, comprising:
   a projection system which projects a first pattern;
   a measuring system which obtains a measure corresponding to a focus state of the first pattern by said projection system;
   a determination system which determines a focus position of said projection system based on a plurality of measures obtained by said measuring system with respect to a plurality of positions of the first pattern in a direction along which the first pattern is projected by said projection system; and
   a control system which causes said determination system to initiate determining the focus position based on a subsequent measure obtained by said measuring system with respect to a position of the first pattern corresponding to the focus position having been determined by said determination system.

2. An apparatus according to claim 1, further comprising a stage which holds a substrate, wherein the first pattern is formed on said stage, and said projection system projects a second pattern onto the substrate.

3. An apparatus according to claim 1, wherein the first pattern is formed on a substrate to be exposed to a second pattern, and is used for aligning the substrate.

4. An apparatus according to claim 1, further comprising a stage which holds a substrate to be exposed to a second pattern, wherein the first pattern is formed on said stage and used for aligning the substrate.

5. An apparatus according to claim 1, wherein the first pattern is formed on an original plate including a second pattern to which a substrate is exposed, and used for aligning the original plate.

6. An apparatus according to claim 1, wherein the plurality of positions of the first pattern are determined based on the focus position having been determined by said determination system.

7. An apparatus according to claim 6, wherein if the focus position can not be determined with respect to the plurality of positions of the first pattern, a subsequent plurality of positions of the first pattern are determined based on measures obtained by said measuring system with respect to the preceding plurality of positions of the first pattern.

8. An apparatus according to claim 1, wherein said control system causes said determination system to initiate determining the focus position, further based on a preceding measure having been obtained by said measuring system for determining the preceding focus position by said determination system.

9. An apparatus according to claim 1, wherein said control system causes said determination system to initiate determining the focus position, further based on a interpolated measure which is obtained from preceding measures having been obtained by said measuring system for determining the preceding focus position by said determination system and corresponds to the preceding focus position.

10. An apparatus according to claim 9, wherein said control system causes said determination system to initiate determining the focus position, based on one of difference and comparison, between the interpolated measure and the subsequent measure.

11. A device manufacturing method comprising a step of exposing a substrate to a pattern using an exposure apparatus defined in claim 1.

\* \* \* \* \*

UNITED STATES PATENT AND TRADEMARK OFFICE
CERTIFICATE OF CORRECTION

PATENT NO. : 6,714,281 B1
DATED : March 30, 2004
INVENTOR(S) : Toshitaka Amano et al.

It is certified that error appears in the above-identified patent and that said Letters Patent is hereby corrected as shown below:

Drawings,
Sheet 9, FIG. 10, in step "S202," PREPARE" should read -- PREPARE --.
Sheet 14, FIG. 15, in "STEP 14," "INPLANTATION" should read
-- IMPLANTATION --.

Column 1,
Line 5, "A" should read -- THE --.
Line 13, "function" should read -- function, --.

Column 3,
Line 15, "detect" should read -- to detect --.

Column 4,
Line 33, "high-integrated" should read -- highly-integrated --.

Column 11,
Line 39, "beat" should read -- best --.

Column 12,
Line 14, "auto-focusingly measured" should read -- measured with an auto-focusing measurement --.
Line 37, "conventionally" should read -- conventional -- and "for" should be deleted.
Line 38, "timing every" should read -- timing for every --.
Line 43, "large," should read -- large --.
Line 57, "focusingly-measured" should read -- measured with auto-focusing measurement --

Column 13,
Line 5, the first occurrence of "the" should be deleted.
Line 15, "largely" should read -- greatly --.
Line 25, "auto-focusingly" should be deleted.
Line 26, "measured (steps" should read -- measured with auto– focusing measurement (steps --.
Line 37, "conventionally" should read -- conventional --.

UNITED STATES PATENT AND TRADEMARK OFFICE
CERTIFICATE OF CORRECTION

PATENT NO. : 6,714,281 B1
DATED : March 30, 2004
INVENTOR(S) : Toshitaka Amano et al.

It is certified that error appears in the above-identified patent and that said Letters Patent is hereby corrected as shown below:

Column 16,
Line 22, "measured," should read -- measured --.

Column 18,
Line 39, "can not" should read -- cannot --.
Line 52, "a" should read -- an --.

Signed and Sealed this

Sixteenth Day of November, 2004

JON W. DUDAS
*Director of the United States Patent and Trademark Office*